United States Patent [19]

Okamura

[11] Patent Number: 5,604,671
[45] Date of Patent: Feb. 18, 1997

[54] CHARGE PUMP CIRCUIT FOR BOOSTING VOLTAGE

[75] Inventor: Hitoshi Okamura, Tokyo, Japan

[73] Assignee: NEC Corporation, Tokyo, Japan

[21] Appl. No.: 421,890

[22] Filed: Apr. 14, 1995

[30] Foreign Application Priority Data

Apr. 18, 1994 [JP] Japan ................... 6-078298

[51] Int. Cl.$^6$ ................................. H02M 3/18
[52] U.S. Cl. .................. 363/60; 363/59; 327/536
[58] Field of Search ............ 363/59, 60; 307/109, 307/110; 327/536, 589

[56] References Cited

U.S. PATENT DOCUMENTS

| | | | |
|---|---|---|---|
| 4,527,213 | 7/1985 | Ariizumi | 361/56 |
| 4,961,007 | 10/1990 | Kumanoya et al. | 307/296.2 |
| 5,280,420 | 1/1994 | Rapp | 363/60 |
| 5,289,062 | 2/1994 | Wyland | 307/577 |
| 5,426,333 | 6/1995 | Meada | 327/536 |

*Primary Examiner*—Peter S. Wong
*Assistant Examiner*—Adolf Berhane
*Attorney, Agent, or Firm*—Foley & Lardner

[57] ABSTRACT

A charge pump circuit for boosting a supply voltage has two bipolar transistors instead of MOS transistors for obtaining a large current drivability without enlargement in the size of the circuit. One of the bipolar transistors replenishes charge to an internal charge-up node from a high potential source line and the other of the bipolar transistors supply output current to a load. The latter of the bipolar transistors may be replaced by a resistor and a plurality of the charge pump circuits may be cascaded for obtaining a higher boosting function of potential and a large current drivability.

6 Claims, 6 Drawing Sheets

CHARGE PUMP CIRCUIT FOR BOOSTING VOLTAGE

BACKGROUND OF THE INVENTION

1. Field of the Invention

The present invention relates to a charge pump circuit and, more particularly, to a so-called charge pump circuit for outputting a signal having a boosted voltage higher than the voltage supplied from outside of the circuit.

2. Description of the Related Art

A conventional charge pump circuit in a semiconductor device has a configuration such as shown in FIG. 1. A first N-channel MOS transistor (hereinafter referred to as simply an "NMOS transistor") 36 is connected between a VCC line 11 and an internal charge-up node 17. A second NMOS transistor 37 is connected between the internal charge-up node 17 and an output terminal 12. The internal charge-up node 17 is connected via a capacitor element 18 to a CMOS inverter 19, which receives a clock signal. The charge pump circuit has a function of boosting a supply voltage to output a higher voltage to an external load while receiving a regularly varing signal such as a clock signal.

In operation, when the potential of the clock signal input to the CMOS inverter 19 rises, the potential at the internal charge-up node 17 rises due to the capacitive coupling by the capacitor element 18. At this time, if the potential at the output terminal 12 is lower than the potential at the internal charge-up node 17, current flows from the internal charge-up node 17 to the output terminal 12 through the second NMOS transistor 37, so that a load (not shown in the drawing) connected to the output terminal 12 is provided with charge.

When the potential of the clock signal subsequently rises and the potential at the internal charge-up node 17 falls accordingly due to the capacitive coupling of the capacitor element 18, the charge lost from the input charge-up node 17 to the load is replenished from the VCC line 11 via the first NMOS transistor 36. In cases where the parasitic capacitance existing between the internal charge-up node 17 and ground is significantly small as compared to the capacitance of the capacitor element 18 and the amount of current required to charge the load is small, the potential at the internal charge-up node 17 rises to a potential which is lower than double the power-supply voltage by the threshold voltage $V_T$ of the first NMOS transistor 36, when the clock signal falls. Accordingly, in an ideal state of the circuit, the potential at the output terminal 12 reaches a potential which is determined by subtracting, from twice the magnitude of the power-supply voltage, the sum of the threshold voltage $V_{T36}$ of the first NMOS transistor 36 and the threshold voltage $V_{T3}$ of the second NMOS transistor 37.

Since each of the first and second NMOS transistors 36 and 37 has a so-called diode connection, substantially no current flows through the output terminal 12 into the internal charge-up node 17. In practical cases, the gates of the first and second NMOS transistors 36 and 37 are formed to have a large width to sufficiently lower their resistance in an ON state. Namely, the NMOS transistors are designed such that the diffusion capacitances and the gate capacitances of the NMOS transistors 36 and 37 are large.

The conventional charge pump circuit as described above, however, can only boost voltage within a limited range, as will be detailed later.

SUMMARY OF THE INVENTION

It is an object of tile present invention to provide a charge pump circuit in a semiconductor device having a large boosting function and a relatively small size in circuit structure.

In accordance with the present invention, there is provided a charge pump circuit comprising a first input terminal, an output terminal, a first capacitor element having a first electrode connected to the input terminal and a second electrode, a first bipolar transistor having a current path connected between the second electrode of the first capacitor element and a high potential source line, and a second bipolar transistor having a current path connected between the second electrode of the first capacitor element and the output terminal.

In the present invention, the second bipolar transistor may be replaced by a resistor.

BRIEF DESCRIPTION OF THE DRAWINGS

The above and other objects, features and advantages of th present invention will be more apparent from the following description, taken in conjunction with accompanying drawings in which.

DESCRIPTION OF PREFERRED EMBODIMENTS

Before describing embodiments of the present invention, the problems invlolved in the conventional charge pump circuit will be detailed for the sake of understanding of the present invention.

Figure 1:
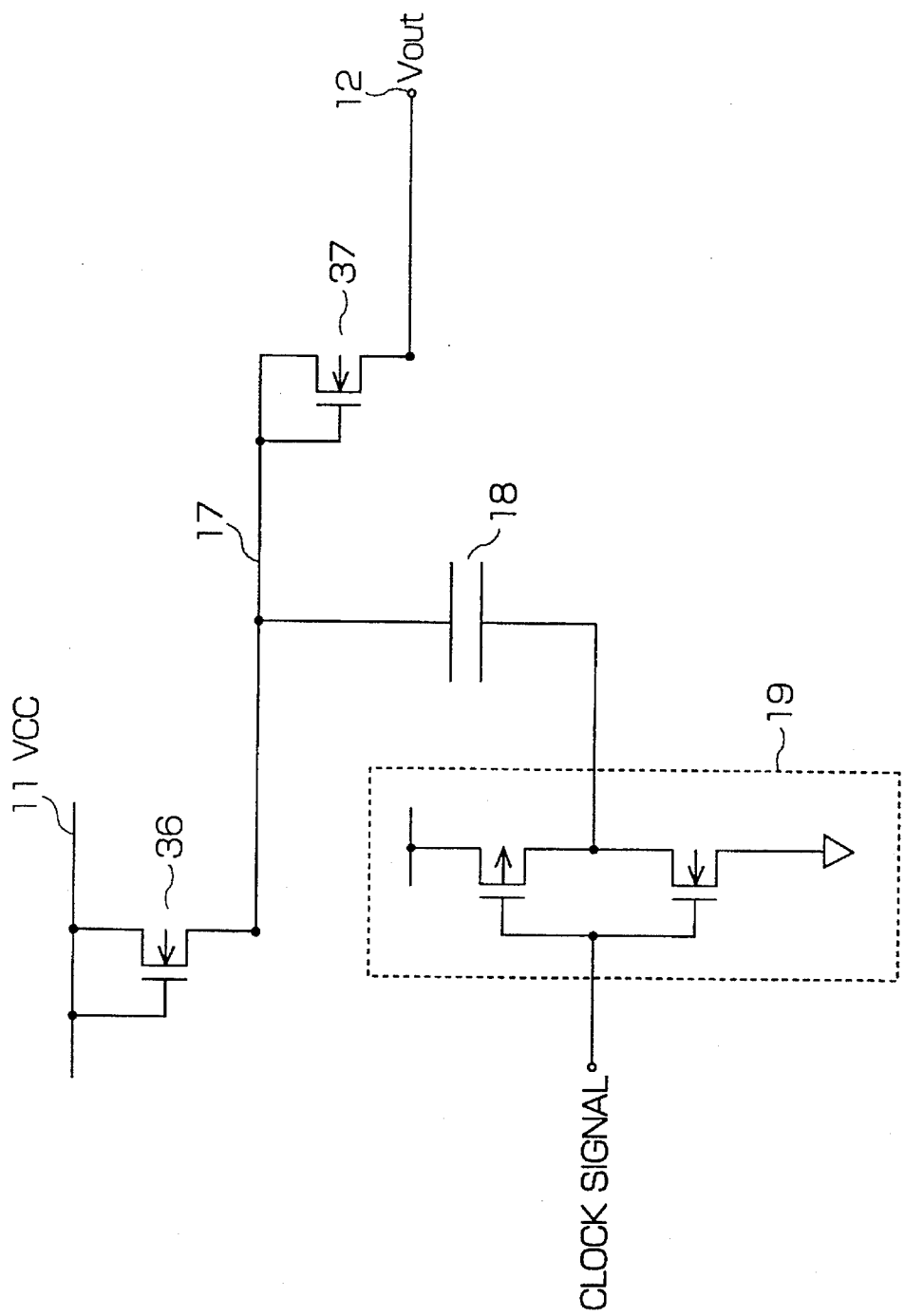
FIG. 1 is a circuit diagram showing a conventional charge pump circuit.

In the conventional charge pump circuit of FIG. 1, the NMOS transistor 37 for supplying a load current through the internal charge-up node 17 and the NMOS transistor 36 for replenishing charge from the VCC line 11 to the internal charge-up node 17 should have wide gates so as to decrease their resistances in an ON state, if the load connected to the output terminal 12 is heavy, i.e., if an ability to supply a large amount of current is demanded.

Meanwhile, the degree of increase in the potential at the internal charge-up node 17 is determined by the ratio of the capacitance of the capacitor element 18 to the parasitic capacitance existing around the internal charge-up node 17. When NMOS transistors having wide gates are used in the circuit, the potential at the internal charge-up node 17 cannot be sufficiently boosted, because the parasitic capacitance of the internal charge-up node 17 increases due to enlargement of the diffusion areas of the NMOS transistors 36 and 37. This problem may be solved by increasing the capacitance of the capacitor element 18 to thereby decrease the ratio of the parasitic capacitance of the internal charge-up node 17 to the capacitance of the capacitor element 18. However, this involves a disadvantage that the area occupied by the charge pump circuit significantly increases. Hence, there is a limit in increasing the capacitance of the capacitor element 18, and consequently in obtaining a large boosting function of the charge pump circuit.

Now, the present invention will be described with reference to the drawings.

Figure 2:
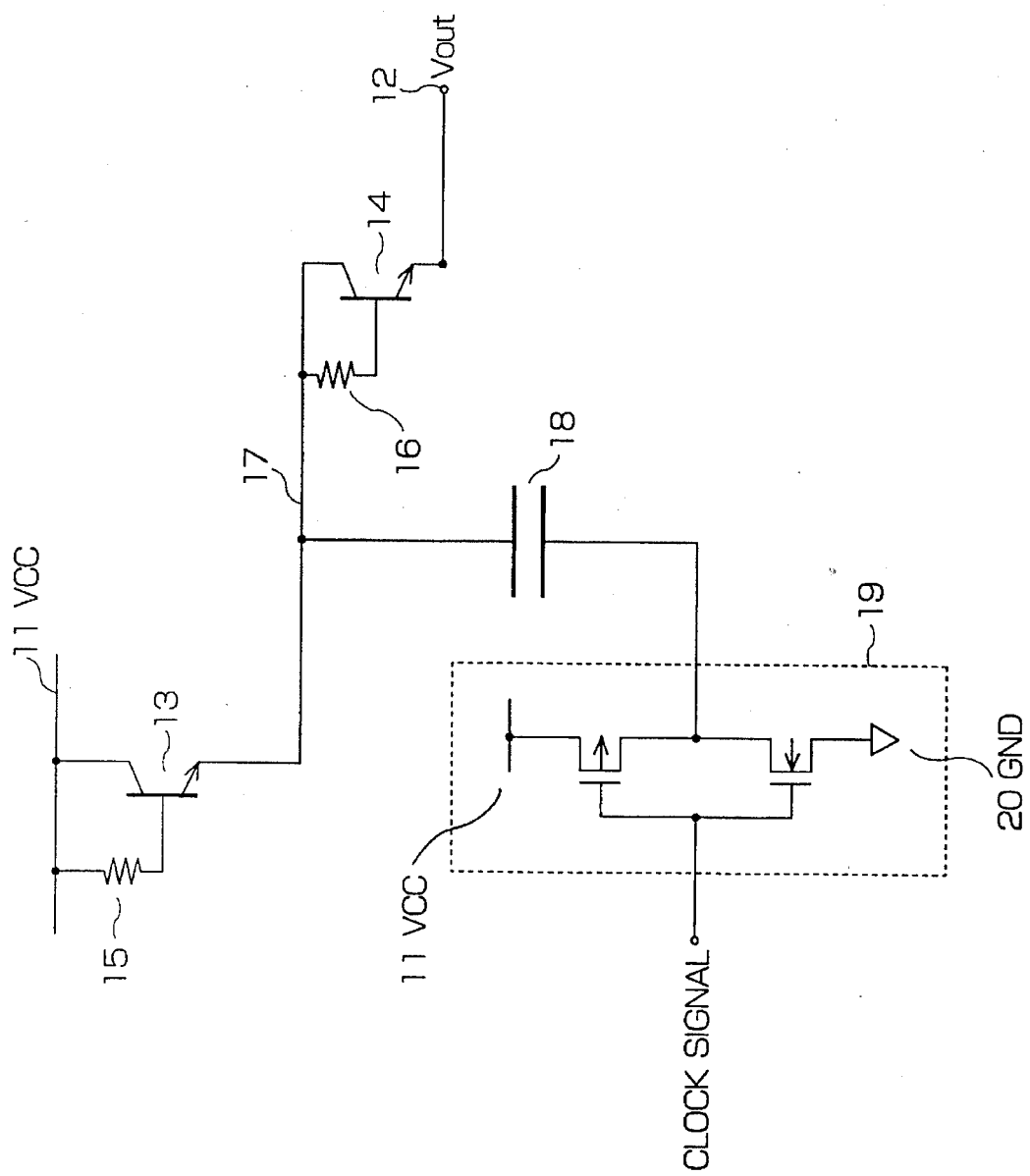
FIG. 2 is a circuit diagram showing a charge pump circuit according to a first embodiment of the present invention.

Referring to FIG. 2, there is shown a charge pump circuit according to a first embodiment of the present invention. The collector of a first NPN bipolar transistor (NPN transistor) 13 is connected to a VCC line 11, and the emitter thereof is connected to an internal charge-up node 17. The base of the first NPN transistor 13 is connected to the VCC line 11 via a first resistor 15. The collector of a second NPN transistor 14 is connected to the internal charge-up node 17 while the emitter thereof is connected to an output terminal 12 of the charge pump circuit. The base of the second NPN transistor 14 is connected to the internal charge-up node 17 via a second resistor 16.

A CMOS inverter 19 is provided as an input section of the charge pump-up circuit for receiving an input clock signal. The CMOS inverter 19 is connected between the VCC line 11 and a GND line 20 for receiving a power-supply voltage. A capacitor 18 is provided for operating capacitive coupling function and has a first terminal connected to the output node of the CMOS inverter 19 and a second terminal connected to the internal charge-up node 17.

In operation, when the potential of the input terminal of the charge pump circuit receiving the clock signal falls and the potential at the output node of the CMOS inverter 19 rises, the potential at the internal charge-up node 17 also rises due to the capacitive coupling through the capacitor element 18.

The amplitude $V_{pump}$ of the pumped voltage at the internal charge-up node 17 in the charge pump circuit of FIG. 2 can be expressed by the following equation:

$$V_{pump} = \{C_{pump}/(C_{para}+C_{pump})\} \cdot VCC,$$

wherein VCC is a power source voltage, $C_{para}$ is a total of the parasitic capacitances of bipolar transistors 13 and 14, resistor 16, wiring, etc., existing around the internal charge-up node 17, and $C_{pump}$ is the capacitance of the capacitor element 18. Accordingly, a fundamental requirement for obtaining an efficient charge-up or charge pump function is to make $C_{para}$ as small as possible as compared to $C_{pump}$. Accordingly, the circuit of the present embodiment is designed such that $C_{pump}$ is as large as 5 pF, for example. If a parasitic capacitance of wiring is put aside from consideration, the parasitic capacitance existing around the internal charge-up node 17 is composed of the emitter parasitic capacitance of the NPN transistor 13, the collector capacitance of the NPN transistor 14, and the parasitic capacitance of the resistor 16. The NPN transistors 13 and 14 have an emitter size of 0.8×6.4 μm², so that the collector capacitance of the second NPN transistor 14 and the emitter capacitance of the first bipolar transistor 13 are made as small as between 20 fF and 40 fF, respectively, by the current technology, indicating that those capacitances are significantly small as compared to $C_{pump}$.

In operation, when the potential at the internal charge-up node 17 is boosted higher than the potential at the output terminal 12, the second NPN transistor 14 is turned on so that the load (not shown) connected to the output terminal 12 is provided with charge. In this state, a reverse bias voltage acts between tile base and emitter of the first NPN transistor 13, so that current does not flow in a reverse direction from the internal charge-up node 17 to the VCC line 11. Accordingly, the potential at the internal charge-up node 17 falls. The degree of this voltage drop is substantially determined by a relation between the amount of charge supplied through the output terminal 12 and the capacitance of the capacitor 18.

When the clock signal rises, the potential at the internal charge-up node 17 falls accordingly, turning the first NPN transistor 13 on. As a result, charge is replenished from the VCC line 11 to the internal charge-up node 17, so that the potential at the internal charge-up node 17 is maintained at a potential which is lower than the potential at the VCC line 11 by the base-to-emitter forward voltage (hereinafter referred to simply as "$V_F$") of the NPN transistor 13. In this state, a reverse bias voltage acts between the base and emitter of the second NPN transistor 14, so that current does not flow in a reverse direction from the output terminal 12 to the internal charge-up node 17. When the clock signal falls again, the potential at the internal charge-up node 17 is boosted above VCC. By repeating this operation, the potential $V_{OUT}$ at the output terminal 12 is boosted to a potential expressed by the following equation:

$$V_{OUT} = VCC - V_F + V_{PUMP} - V_F$$

$$= VCC - 2V_F + \{C_{PUMP}/(C_{PARA}+C_{PUMP})\} \cdot VCC.$$

When $C_{PARA}$ is ignorable relative to $C_{PUMP}$, the following equation can be obtained:

$$V_{OUT} = 2(VCC - V_F).$$

Accordingly, the lowest power-supply voltage $VCC_{min}$ at which the charge pump circuit can provide voltage-boosting function is expressed by equation:

$$VCC_{min} = 2V_F.$$

If the load is resistive, and the current therefore must be continuously supplied thereto from the charge pump circuit, charge must be replenished through the first and second NPN transistors 13 and 14. When the clock signal falls after the accumulated charge is discharged from the internal charge-up node 17 to the load through the second NPN transistor 14, the potential at the internal charge-up node 17 falls. However, when the potential at the internal charge-up node 17 becomes 100 mV lower than the potential at the same node in the previous state, the first NPN transistor 13 is turned on to thereby provide charge to the internal charge-up node 17 so that the potential at the internal charge-up node 7 is recovered by the collector current of the first NPN transistor 13 which ranges as high as between several mA and 10 mA. In the present invention, charge can be replenished efficiently in this manner from the first bipolar transistor 13 so as to attain a large boosting function of the charge pump circuit.

Figure 3:
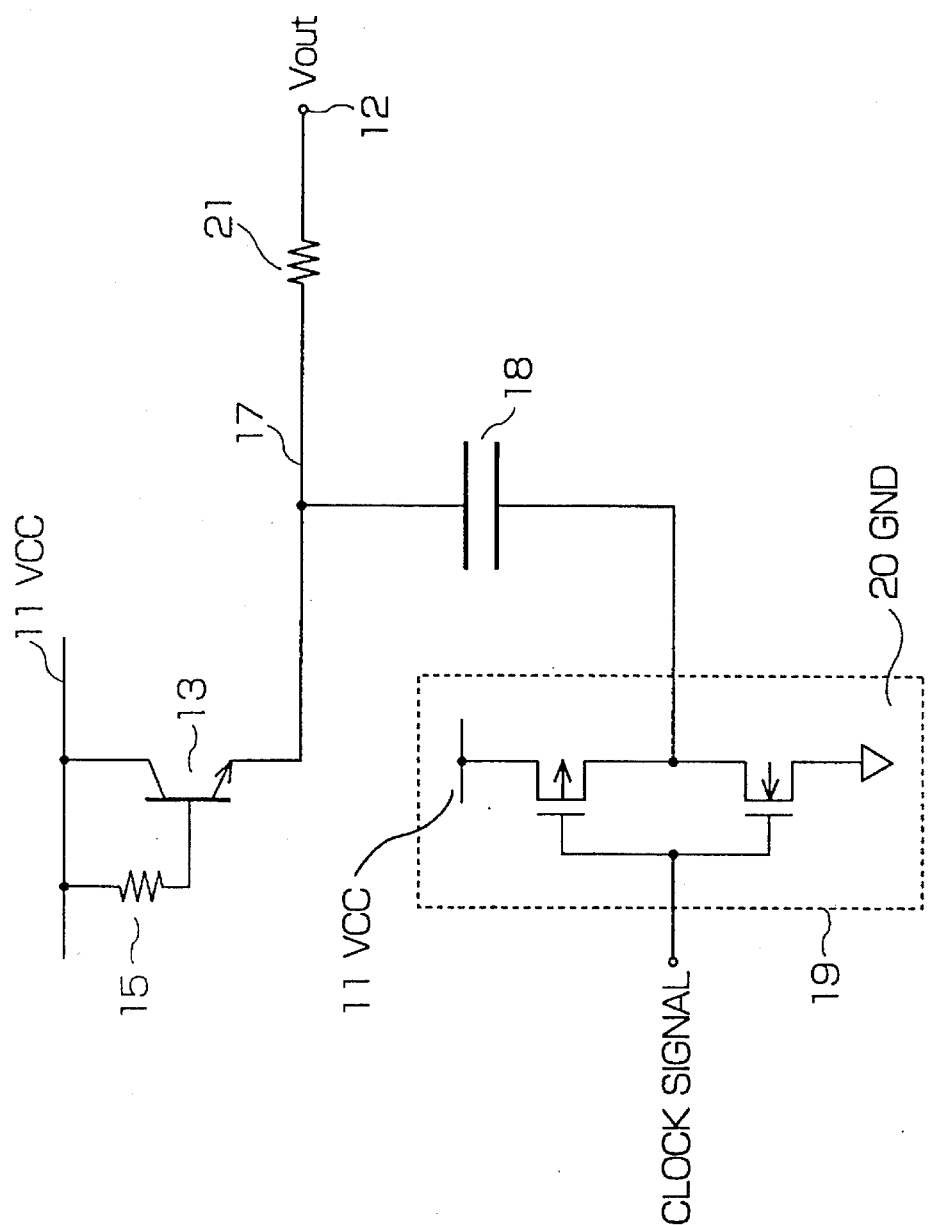
FIG. 3 is a circuit diagram showing a charge pump circuit according to a second embodiment of the present invention.

Referring to FIG. 3, there is shown a charge pump circuit according to a second embodiment of the present invention. The present embodiment differs from the first embodiment in that the second NPN transistor 14 used in the first embodiment is omitted, and only a second resistor 21 is provided between the internal charge-up node 17 and the output terminal 12 of the charge pump circuit. This configuration is similar to that of the first embodiment, and similar elements are designated by the same reference numerals both in FIG. 2 and in FIG. 3.

In the second embodiment, the output impedance through which charge is supplied from the internal charge-up node 17 to the output terminal 12 is high due to the resistor 21, so that current drivability (degree of current amount which the circuit can supply) of the charge pump circuit is relatively low. However, since no PN-junction is interposed between the output terminal 12 and the internal charge-up node 17, the potential at the output terminal 12 can be boosted to a level which is higher than that obtained in the first embodiment by $V_F$, so long as the charge pump circuit is requested to supply a relatively small amount of current. In other words, the minimum power-supply voltage at which the charge pump circuit can provide a voltage-boosting function is equal to $V_F$.

Figure 4:
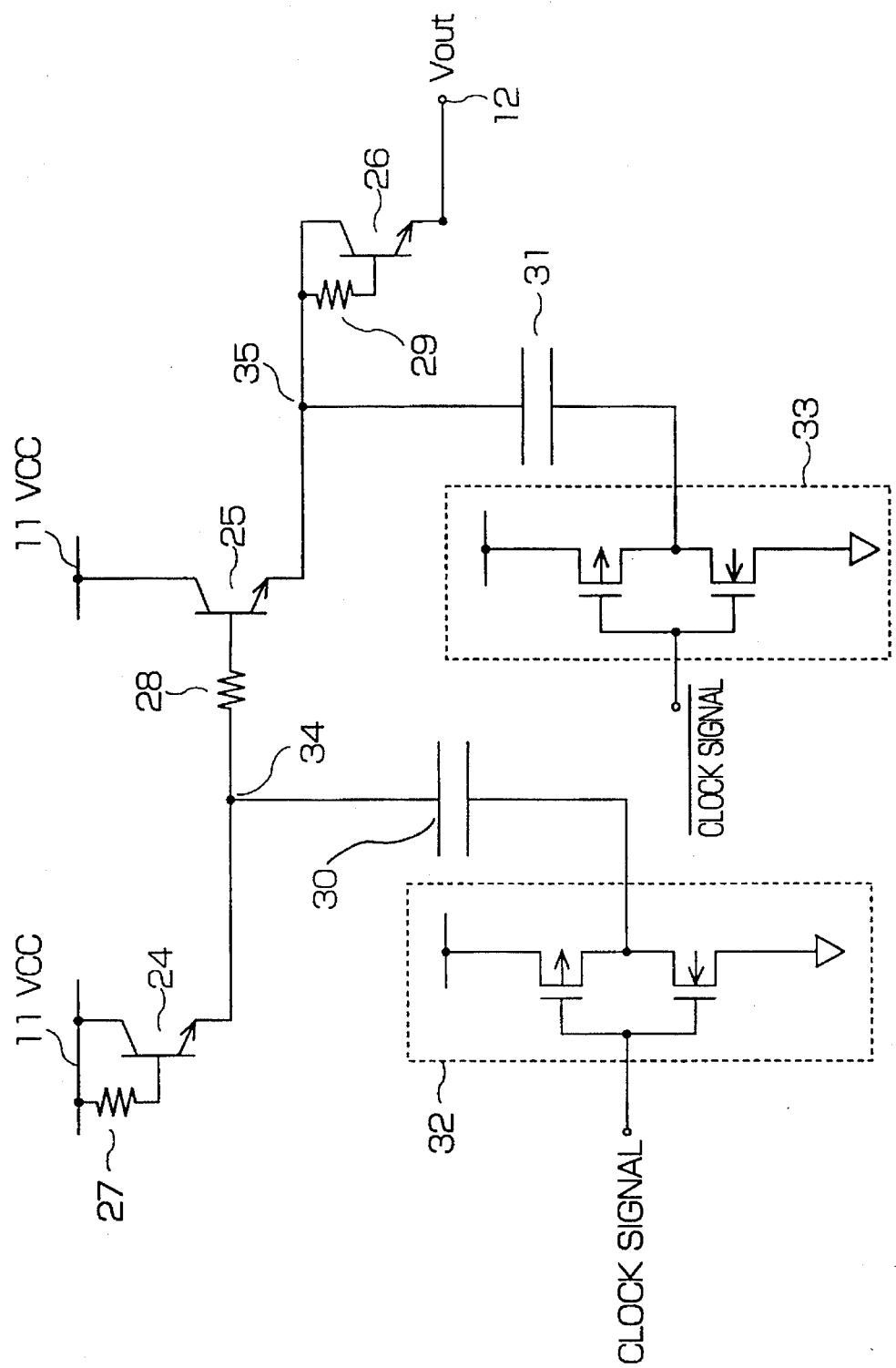
FIG. 4 is a circuit diagram showing a charge pump circuit according to a third embodiment of the present invention.

Referring to FIG. 4, there is shown a charge pump circuit according to a third embodiment of the present invention. In the present embodiment, a first stage charge pump section implementing the second embodiment and a second stage charge pump section implementing the first embodiment are combined so as to lower the minimum power-supply voltage at which the voltage-boosting function can be obtained, and to increase the current drivability of the charge pump circuit.

In the drawing, the collector of a first NPN transistor 24 is connected to a VCC line 11, and the base thereof is connected to the VCC line 11 via resistor 27. The emitter of the first NPN transistor 24 is connected to a first internal charge-up node 34. The collector of a second NPN transistor 25 is connected to the VCC line 11, and the base thereof is connected to the first internal charge-up node 34 via resistor 28. Also, the emitter of the second NPN transistor 25 is connected to a second internal charge-up node 35. Moreover, the collector of a third NPN transistor 26 is connected to the second internal charge-up node 35, and the base thereof is connected to the second internal charge-up node 35 via resistor 29. The emitter of the third NPN transistor 26 is connected to an output terminal 12.

A first and a second CMOS inverters are provided in respective stages for receiving an input clock signal and an input clock signal having a phase opposite to that of the clock signal, respectively. The first internal charge-up node 34 is connected to tile output node of the first CMOS inverter 32 via a first capacitor 30 while the second internal charge-up node 35 is connected to the output node of the second CMOS inverter 33 via a second capacitor 31.

Since the charge at the first internal charge-up node 34 of the first stage is used to drive only the base of the second NPN transistor 25 of the second stage, only resistor 28 interposed between the first charge-up node 34 and the base of the second NPN transistor 25 is sufficient for the charge pump function of the first stage section, and it is not necessary to insert a PN-junction between the first internal charge-up node 34 and the base of the second NPN transistor 25 of the second stage. In this configuration, the potential at the first internal charge-up node 34, i.e., the potential at the base of the second NPN transistor 25 is boosted to a potential expressed by:

$$2 \times VCC - V_F.$$

In operation, when tile potential at the first internal charge-up node 34 exceeds VCC, a forward bias voltage is applied between the base and collector of the second NPN transistor 25. However, resistor 28 restricts current flowing from the first internal charge-up node 34 to the VCC line 11. Subsequently, the potential at the second internal charge-up node 35 is boosted by the function of the second capacitor 31 and the second CMOS inverter 33. On that occasion, there is a certain delay before the base potential phase of the clock signal supplied to the second CMOS inverter 33 is shifted by 180 degrees from the phase of the clock signal supplied to the first CMOS inverter 32, the second NPN transistor 25 can be turned on when the potential at the second internal charge-up node 35 falls, so that the potential at the second internal charge-up node 35 is hindered from falling from VCC, which defines the lower potential level of the second charge-up node 35. Hence, the higher potential level at the second internal charge-up node 35 reaches a level as high as 2×VCC.

When the potential at the second internal charge-up node 35 becomes higher than the output terminal 12, the third NPN transistor 26 is turned on to supply current to the external load. Accordingly, the potential level at the output terminal 12 is boosted to a level represented by:

$$2 \times VCC - V_F.$$

Assuming that $V_F$ is 0.8 V, the boosting function can be obtained at a power-supply voltage VCC as low as 0.9 V. Moreover, sufficient current drivability can be obtained in the third embodiment.

Figure 5:
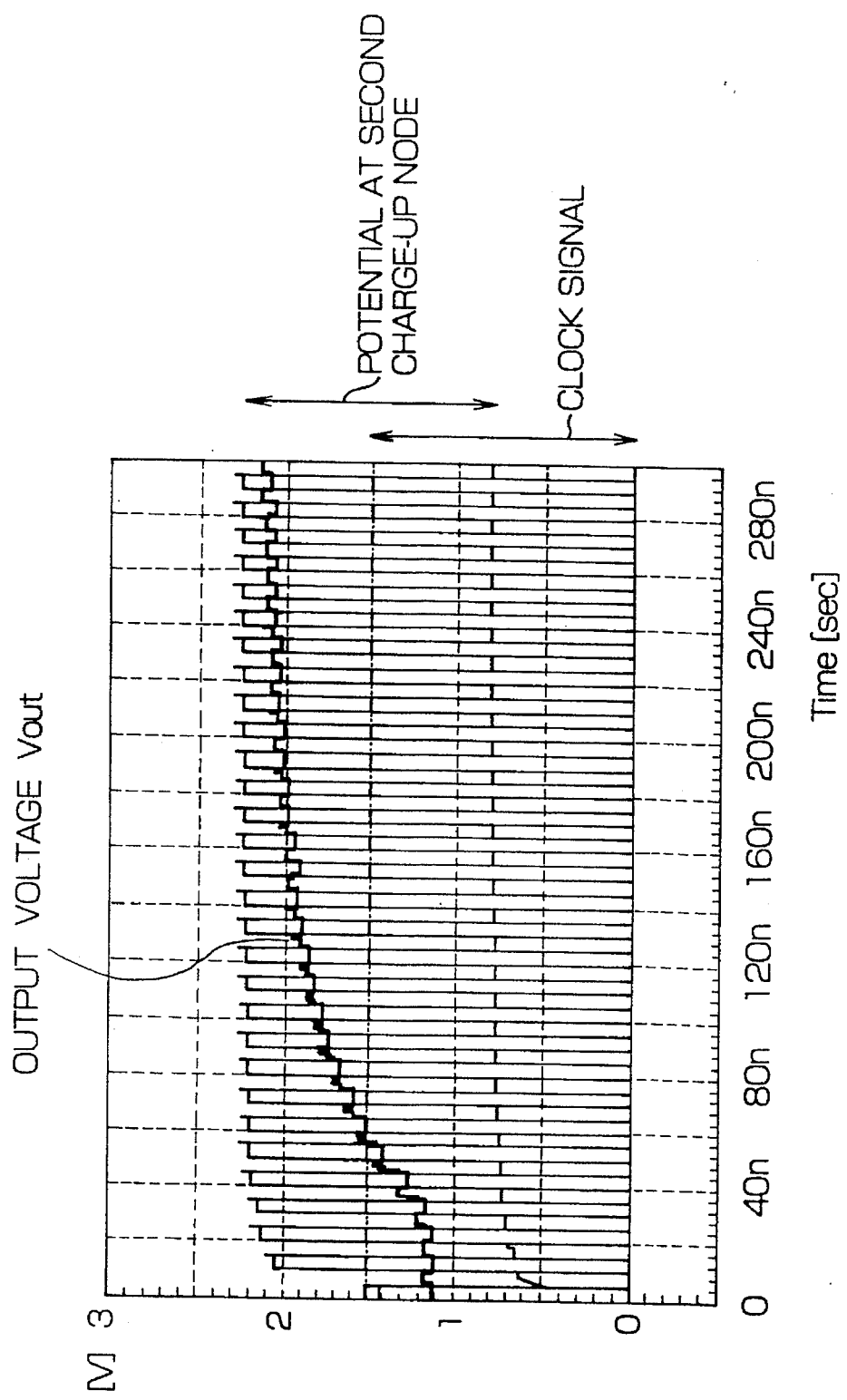
FIG. 5 is a waveform chart showing operation in simulation of the charge pump circuit of FIG. 4.

Referring to FIG. 5, there is shown waveforms of an input clock signal, potential at the second charge-up node and an output signal in a simulation of the charge pump circuit of the third embodiment, by employing SPICE. In the simulation, the period of the clock signal and the supply voltage are selected at 8 ns and 1.5 V, respectively. As shown in the drawing, an output voltage as high as 2.1 V was obtained at the power-supply voltage of 1.5 V in the simulation.

The third embodiment employs a two-stage structure in which the charge pump circuit of the second embodiment is used in the first stage section while the charge pump circuit of the first embodiment is used in the second stage section. However, the structure may be modified in various ways without departing from the scope of the present invention. For example, a multistage structure may be employed in which a plurality of stages each implementing the second embodiment are connected in cascades, and a single stage implementing the first embodiment is provided in the final stage of tile charge pump circuit. With this structure, both higher boosted voltage and large current drivability can be obtained.

As described above, bipolar transistors are used in the charge pump circuits according to the present invention, which may form a multistage structure for an effective charge boosting function and a reduced occupied area. By that configuration, the charge pump circuits can operate at a lower voltage, and have an enhanced current drivability.

Figure 6:
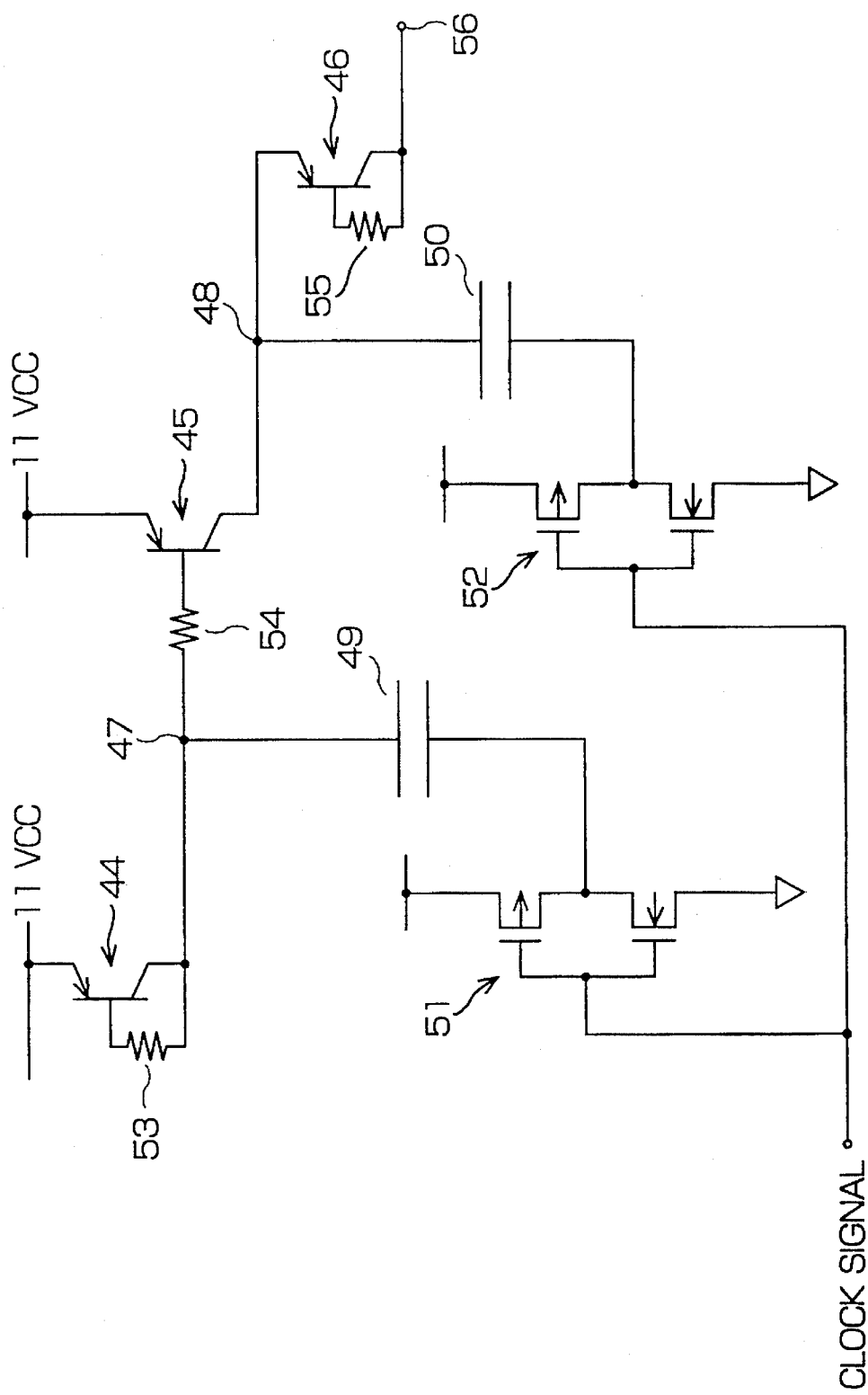
FIG. 6 is a circuit diagram showing a charge pump circuit according to a fourth embodiment of the present invention.

Although charge pump circuits having NPN transistors are described in the embodiments, other charge pump circuit having PNP transistors may be used as well. FIG. 5 shows a charge pump circuit according to a fourth embodiment of the present invention, wherein PNP bipolar transistors are used as a first, a second and a third transistors 44, 45, 46. Since other construction in FIG. 6 is similar to that of FIG. 4, description of the detail thereof will be omitted here for avoiding duplication. In this embodiment, clock signals input to CMOS inverters 51 and 52 have the same in phase.

Also, although the present invention is described with reference to preferred embodiments thereof, the present invention is not limited thereto and various modifications or alterations may be made by persons skilled in the art without departing from the scope of the present invention.

What is claimed is:

1. A charge pump circuit comprising:

a first input terminal, an output terminal, a first capacitor element having first and second electrodes, said first electrode connected to said input terminal, a first bipolar transistor having a current path connected between said second electrode of said first capacitor element and a high potential source line, a second bipolar transistor having a current path connected between said second electrode of said first capacitor element and said output terminal, a second input terminal, a second capacitor element having a first electrode connected to said second input terminal and a second electrode connected to a base electrode of said first bipolar transistor through a resistor element, and a third bipolar transistor having a current path connected between said second electrode of said second capacitor element and said high potential source line.

2. A charge pump circuit as defined in claim 1 wherein each of said first and second input terminals is connected to an output of a CMOS inverter and wherein input signals supplied to said first and second input terminals are opposite to each other in phase.

3. A charge pump circuit with an input terminal and an output terminal, comprising:

a first transistor, a collector of said first transistor being connected to a first potential source, an emitter of said first transistor being connected to an internal charge-up node, and a base of the first transistor being connected to the first potential source via a first resistor;

a second transistor, a collector of the second transistor being connected to the internal charge-up node, an emitter of the second transistor being connected to the output terminal of the charge pump circuit, and a base of the second transistor being connected to the internal charge-up node via a second resistor;

an inverter circuit connected to the input terminal of the charge pump-up circuit for receiving an input clock signal, the inverter circuit being connected between the first potential source and a second potential source, said inverter circuit including complementary MOS transistors; and a capacitor having a first terminal connected to an output node of the inverter circuit and a second terminal connected to the internal charge-up node, wherein when a potential of the input terminal of the charge pump circuit falls and the potential at the output node of the inverter circuit rises, the potential at the internal charge-up node rises due to capacitive coupling through the capacitor.

4. A charge pump circuit, as recited in claim 3, wherein when the potential at the internal charge-up node is higher than the potential at the output terminal, the second transistor turns on and a reverse bias voltage acts between the base and emitter of the first transistor, so that current does not flow in a reverse direction from the internal charge-up node to the first potential source and the potential of the internal charge-up node falls, and when the input clock signal rises, the potential at the internal charge-up node falls, turning on the first transistor, thereby replenishing charge from the first potential source to the internal charge-up node, so that the potential at the internal charge-up node is maintained at a potential which is lower than the potential at the first potential source by a base-to-emitter forward voltage of said first transistor, and a reverse bias voltage acts between the base and emitter of the second transistor, so that the current does not flow in the reverse direction from the output terminal to the internal charge-up node, and thereafter when the input clock signal falls again, the potential at the internal charge-up node is boosted above the first potential source.

5. A charge pump circuit with an input terminal and an output terminal, comprising:

a first transistor, a collector of said first transistor being connected to a first potential source, an emitter of said first transistor being connected to an internal charge-up node, and a base of the first transistor being connected to the first potential source via a first resistor;

a second resistor connected between the internal charge-up node and the output terminal of the charge pump circuit;

an inverter circuit connected to the input terminal of the charge pump-up circuit for receiving an input clock signal, the inverter circuit being connected between the first potential source and a second potential source, said inverter circuit including complementary MOS transistors; and a capacitor with a first terminal connected to an output node of the inverter circuit and a second terminal connected to the internal charge-up node, wherein when a potential of the input terminal of the charge pump circuit falls and the potential at the output node of the inverter circuit rises, the potential at the internal charge-up node rises due to capacitive coupling through the capacitor.

6. A charge pump circuit with an input terminal and an output terminal, comprising:

a first transistor, a collector of said first transistor being connected to a first potential source, a base of said first transistor being connected to the first potential source via a first resistor, and an emitter of the first transistor being connected to a first internal charge-up node;

a second transistor, a collector of the second transistor being connected to the first potential source, a base of the second transistor being connected to the first internal charge-up node via a second resistor, and an emitter of the second transistor being connected to a second internal charge-up node;

a third transistor, a collector of the third transistor being connected to the second internal charge-up node, a base of the third transistor being connected to the second internal charge-up node via a third resistor, and an emitter of the third transistor being connected to the output terminal; and first and second inverter circuits for receiving an input clock signal and an inverted input clock signal respectively, the first internal charge-up node being connected to an output node of the first inverter circuit via a first capacitor, the second internal charge-up node being connected to an output node of the second inverter circuit via a second capacitor, wherein when a potential at the first internal charge-up node exceeds the first potential source, a forward bias voltage is applied between the base and collector of the second transistor, the potential at the second internal charge-up node is boosted by the second capacitor and the second inverter circuit, and when the potential at the second internal charge-up node becomes higher than the output terminal, the third transistor turns on.

* * * * *